United States Patent [19]
Lustig

[11] Patent Number: 5,436,912
[45] Date of Patent: Jul. 25, 1995

[54] CIRCUIT ARRANGEMENT FOR TESTING A SEMICONDUCTOR MEMORY BY MEANS OF PARALLEL TESTS USING VARIOUS TEST BIT PATTERNS

[75] Inventor: Bernhard Lustig, Munich, Germany

[73] Assignee: Siemens Aktiengesellschaft, Munich, Germany

[21] Appl. No.: 983,866
[22] PCT Filed: Aug. 29, 1991
[86] PCT No.: PCT/DE91/00685
 § 371 Date: Mar. 5, 1993
 § 102(e) Date: Mar. 5, 1993
[87] PCT Pub. No.: WO92/04717
 PCT Pub. Date: Mar. 19, 1992

[30] Foreign Application Priority Data

Sep. 11, 1990 [DE] Germany ............... 40 28 819.6

[51] Int. Cl.6 ........................................ G11C 13/00
[52] U.S. Cl. ............................... 371/21.2; 371/21.6
[58] Field of Search ............... 371/15.1, 21.1, 21.6; 365/200, 201

[56] References Cited

U.S. PATENT DOCUMENTS

| 4,384,348 | 5/1983 | Nozaki | 365/201 |
| 5,027,354 | 6/1991 | Ara et al. | 371/25.1 |
| 5,060,230 | 10/1991 | Arimoto et al. | 371/21.2 |
| 5,148,398 | 9/1992 | Kohno | 365/201 |

FOREIGN PATENT DOCUMENTS 0263470 4/1988 European Pat. Off. .

OTHER PUBLICATIONS

"A New Array Architecture For Parallel Testing In VLSI Memories", by Y. Matsuda et al, Proceedings of the International Test Conference, Aug. 1989, pp. 322–326.
"Parallel Testing Technology For VLSI Memories" by J. Inoue et al, Proceedings of the International Test COnference, Sep. 1987, pp. 1066–1071.
"Parallel Testing for Pattern Sensitive Faults in Semiconductor Random Access Memories", by P. Mazumder et al, IEEE Transactions on Computers, vol. 38, No. 3, Mar. 1989, pp. 394–407.
"A 60-ns 3.3 V–Only 16-Mbit DRAM with Multipurpose Register", by K. Arimoto et al, IEEE Journal of Solid-State Circuits, vol. 24, No. 5, Oct. 1989, pp. 1184–1190.

Primary Examiner—Jack B. Harvey
Assistant Examiner—Jeffrey K. Seto
Attorney, Agent, or Firm—Hill, Steadman & Simpson

[57] ABSTRACT

A circuit arrangement for testing a semiconductor memory, in which various test bit patterns can be written into a register (REG) and into memory cell n-tuples (NSPZ), in which the test bit pattern in the register (REG) can be compared with the bit patterns in the memory cell n-tuples (NSPZ) by a multiplicity of comparator circuits (MC), in which the comparator outputs (Mik) are combined by pairs of wired-OR lines to an address matrix (AM), to enable fault location, and in which individual faults (PTSF) and/or multiple faults (PTMF) can be identified by means of a fault type identification circuit (FTE).

8 Claims, 4 Drawing Sheets

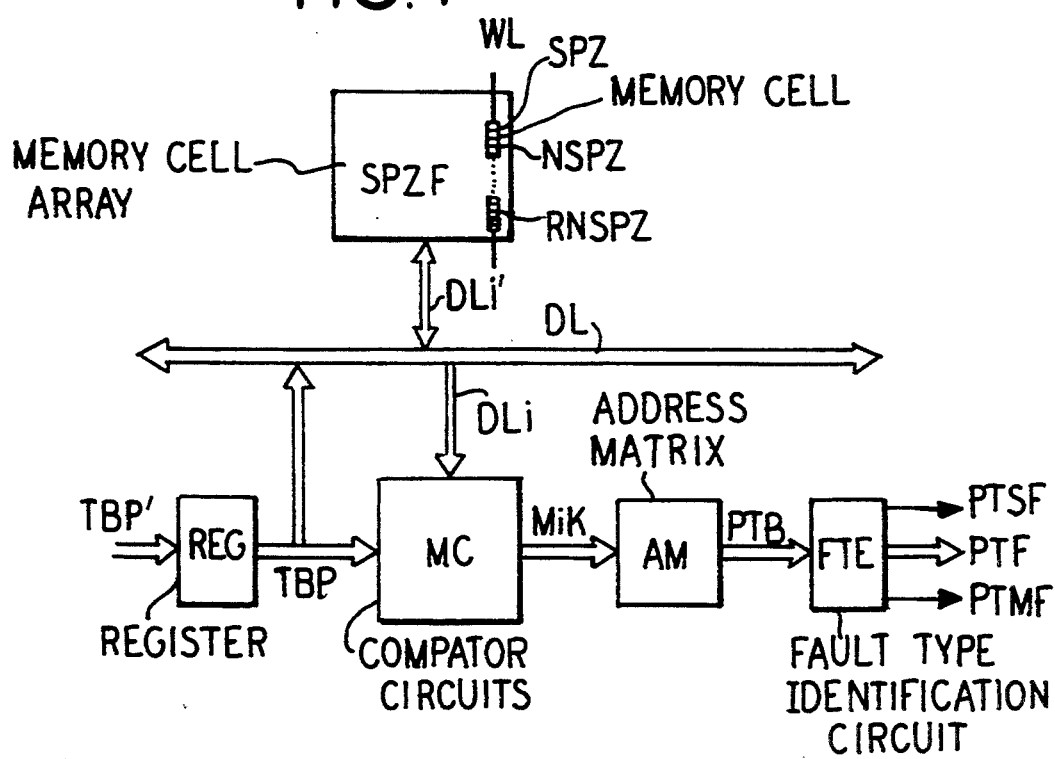
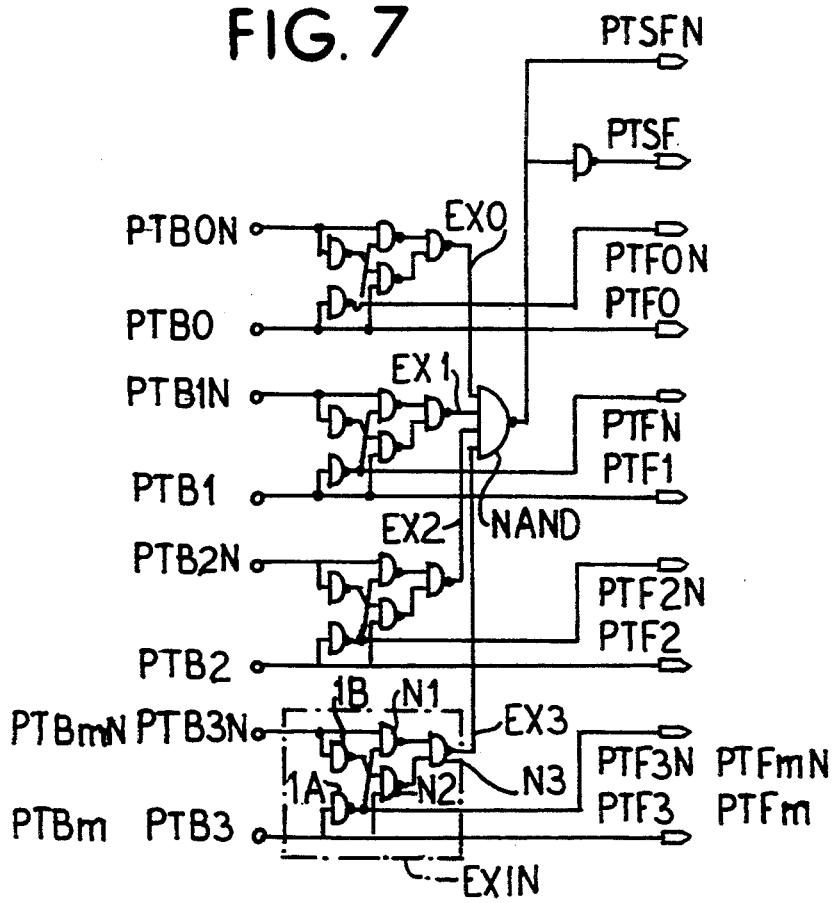

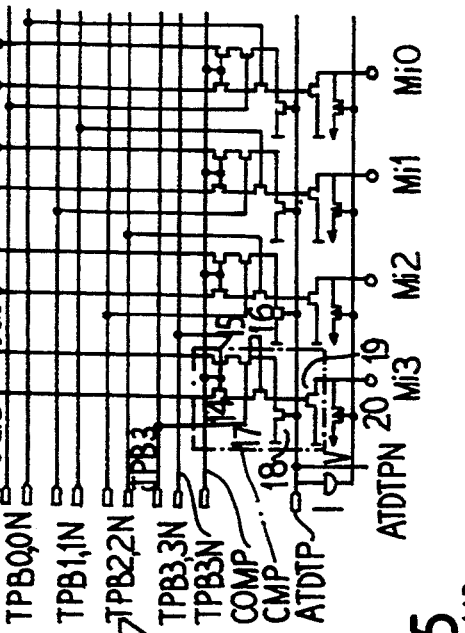
FIG. 2
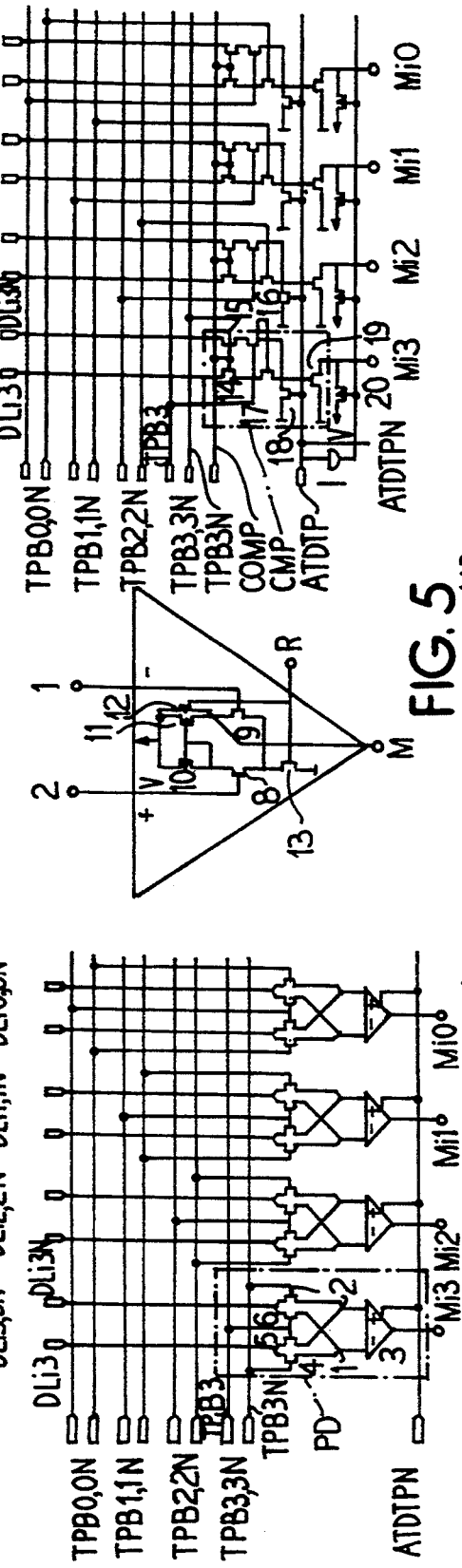
FIG. 3
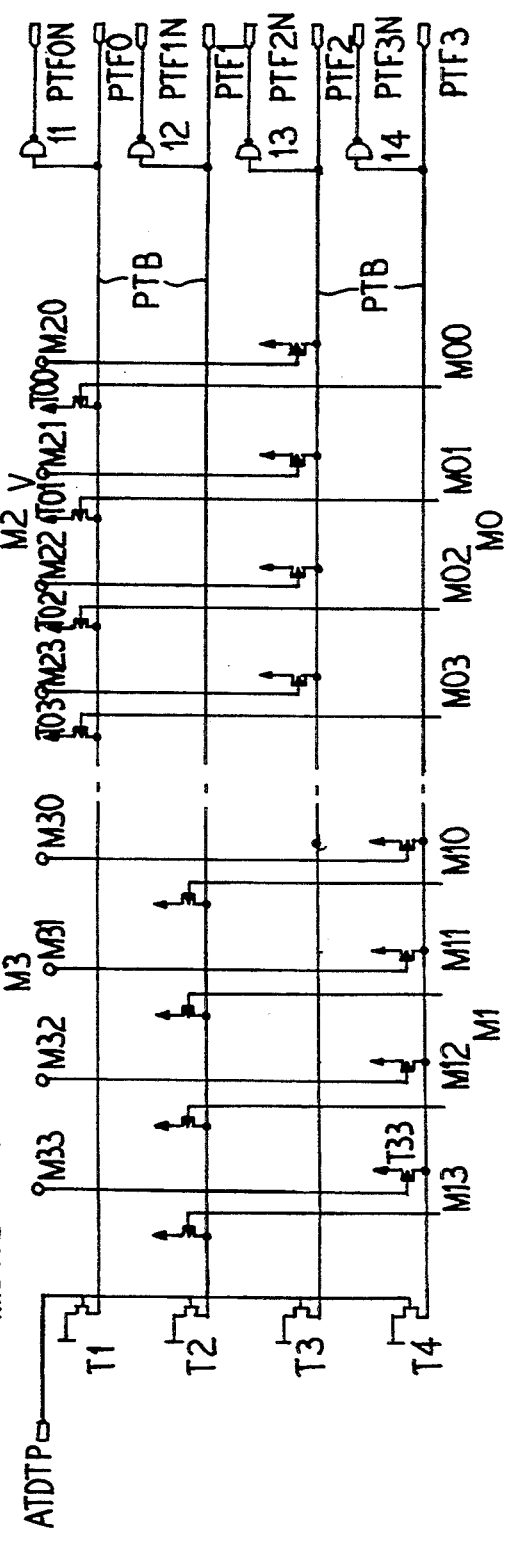
FIG. 4
FIG. 5

CIRCUIT ARRANGEMENT FOR TESTING A SEMICONDUCTOR MEMORY BY MEANS OF PARALLEL TESTS USING VARIOUS TEST BIT PATTERNS

Circuit arrangement for testing a semiconductor memory by means of parallel tests using various test bit patterns.

BACKGROUND OF THE INVENTION

The invention relates to a circuit arrangement for testing a semiconductor memory by means of parallel tests using various test bit patterns for testing semiconductor memories.

A circuit arrangement of this type is known from the publication with the title "A 60-ns 3.3-V-Only 16-Mbit Dram with Multipurpose Register" by K. Arimoto et al. (Mitsubishi Electric Corporation) in the IEEE Journal of Solid-State Circuits, Vol. 24, No. 5, October 1989 (page 1184 to 1190). This arrangement comprises a circuit arrangement for a parallel line-mode-test (LMT), in which random bit patterns are written into a multi-purpose register (MPR) and into memory cells, the bit patterns read out of these memory cells are compared in comparator circuits with the bit patterns of the MPR and the signals from the comparator output are combined by a wired-OR logic connection, in order to switch the addressed word line over to a back-up word line (redundancy) in the event of a fault.

SUMMARY OF THE INVENTION

The invention is based on the object of specifying a circuit arrangement which allows defective individual memory cells or memory cell n-tuples to be located with minimum expenditure. The locating of defective memory cell n-tuples can be used to redirect memory access demands from defective memory cell n-tuples to fault-free memory cell n-tuples (redundant address).

According to the invention, the object is achieved by a circuit arrangement for testing a semiconductor memory means of parallel tests using various test bit patterns, in which any n-tuples of test bits can be written into at least one n-bit long register. The n-tuple of test bits located in each register can be written via data lines of the semiconductor memory into a multiplicity of memory cell n-tuples having a common word line. The n-tuple of test bits located in each register can be supplied to a multiplicity of comparator circuits. The bit patterns of the memory cell n-tuples having a common word line can be read out via data lines of the semiconductor memory and with which the n-tuples of test bits can be compared in the multiplicity of comparator circuits. The comparator outputs of the multiplicity of comparator circuits are combined by pairs of wired-OR lines to form an address matrix, a pair of wired-OR lines corresponding to an address bit. Each pair of wired-OR lines has a zero-line for the state where the address bit is 0, and a one-line for the state where the address bit is 1. All the wired-OR lines can be switched through to a line which is at a reference potential by means of switching transistors of a first conductance type, in order to discharge them before a respective test. Either the zero-line or the one-line of each pair of wired-OR lines can be switched through, by means of each comparator output, via an associated switching transistor of a second conductance type to a supply voltage. The combination of the switched-through one-lines and zero-lines differs either for all the comparator outputs or for all the n-tuples of comparator outputs. In each case one line of the pairs of wired-OR lines is connected to an address output.

The advantage that can be achieved by means of the invention is that the circuit arrangement designed according to the invention allows better fault locating to be achieved than is the case with the known circuit arrangement, that this arrangement allows individual faults to be distinguished from multiple faults and that, by using a comparator circuit according to the invention, no CMOS level, but merely a few tens of millivolts are required on the data lines connected to the inputs of the comparator circuit.

Preferred embodiments of the circuit arrangement are as follows.

The address matrix is constructed as a fault address matrix, in order to locate faulty individual memory cells. For this purpose a binary code is assigned unambiguously to each comparator output. The supply voltage can be switched through to the combination of one-lines and zero-lines corresponding to the relevant binary code via switching transistors of the second conductance type.

The address matrix is constructed as a redundant address matrix to locate faulty memory cell n-tuples. For this purpose a binary code is assigned unambiguously to each n-tuple of comparator outputs. The supply voltage is switched through to the combination of one-lines and zero-lines corresponding to the relevant binary code via switching transistors of the second conductance type.

The pairs of wired-OR lines are connected to the inputs of a fault type identification circuit.

The fault type identification circuit contains a circuit element for identifying individual faults. This circuit element feeds the pairs of wired-OR lines in each case to an EXOR-link. The outputs of the EXOR-link are combined by an AND-link, the output of which is connected to an individual-fault output.

The EXOR-links in the fault type identification circuit are implemented by means of a circuit having three double NAND-gates and two inverters.

The fault type identification circuit contains a circuit element for identifying multiple faults. This circuit element feeds the pairs of wired-OR lines in each case to an AND-link. The outputs of the AND-links are combined by an OR-link, whose output is connected to a multiple-fault output.

At least one comparator circuit is constructed as a parity inverting circuit having four switching transistors and a differential amplifier. The gate of a first switching transistor is connected to a first output of a register output pair and a first line of a data line pair can be switched through to an inverting input of the differential amplifier by means of the first switching transistor. The gate of a second switching transistor is connected to the second output of a register output pair and the first line of the data line pair can be switched through to the non-inverting input of the differential amplifier. The gate of a third transistor is connected to the second output of the register output pair and the second line of the data line pair can be switched through to the inverting input of the differential amplifier by means of the third switching transistor. The gate of the fourth switching transistor is connected to the first output of the register output pair and the second line of the data line pair can be switched through to the non-inverting input of the differential amplifier by means of the fourth switching transistor. In the case of the register output pairs, the second output in each case carries the inverted signal of the first output. In the case of the data line pairs, the second line in each case carries the inverted signal of the first line. During testing of a memory cell, the first line of the data line pair carries the same logic signal as the second output of the register output pair, if the test bit written into the memory cell corresponds to the bit read out of the memory cell. One comparator output is connected to the output of the differential amplifier.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a block diagram of a semiconductor memory to explain the principle of the method of operation of the circuit arrangement according to the invention, FIG. 2 shows a circuit diagram of an arrangement having four comparator circuits, FIG. 3 shows a circuit diagram of an arrangement having four comparator circuits in the form of parity inverting circuits, FIG. 4 shows a detailed circuit diagram of a differential amplifier shown in FIG. 3, FIG. 5 shows a circuit diagram of a combination of comparator outputs by four wired-OR lines, FIG. 7 shows a circuit diagram of a circuit arrangement according to the invention, which contains a fault type identification circuit having individual fault identification together with simultaneous inversion of a fault address signal.

DESCRIPTION OF THE PREFERRED EMBODIMENT

Figure 6:
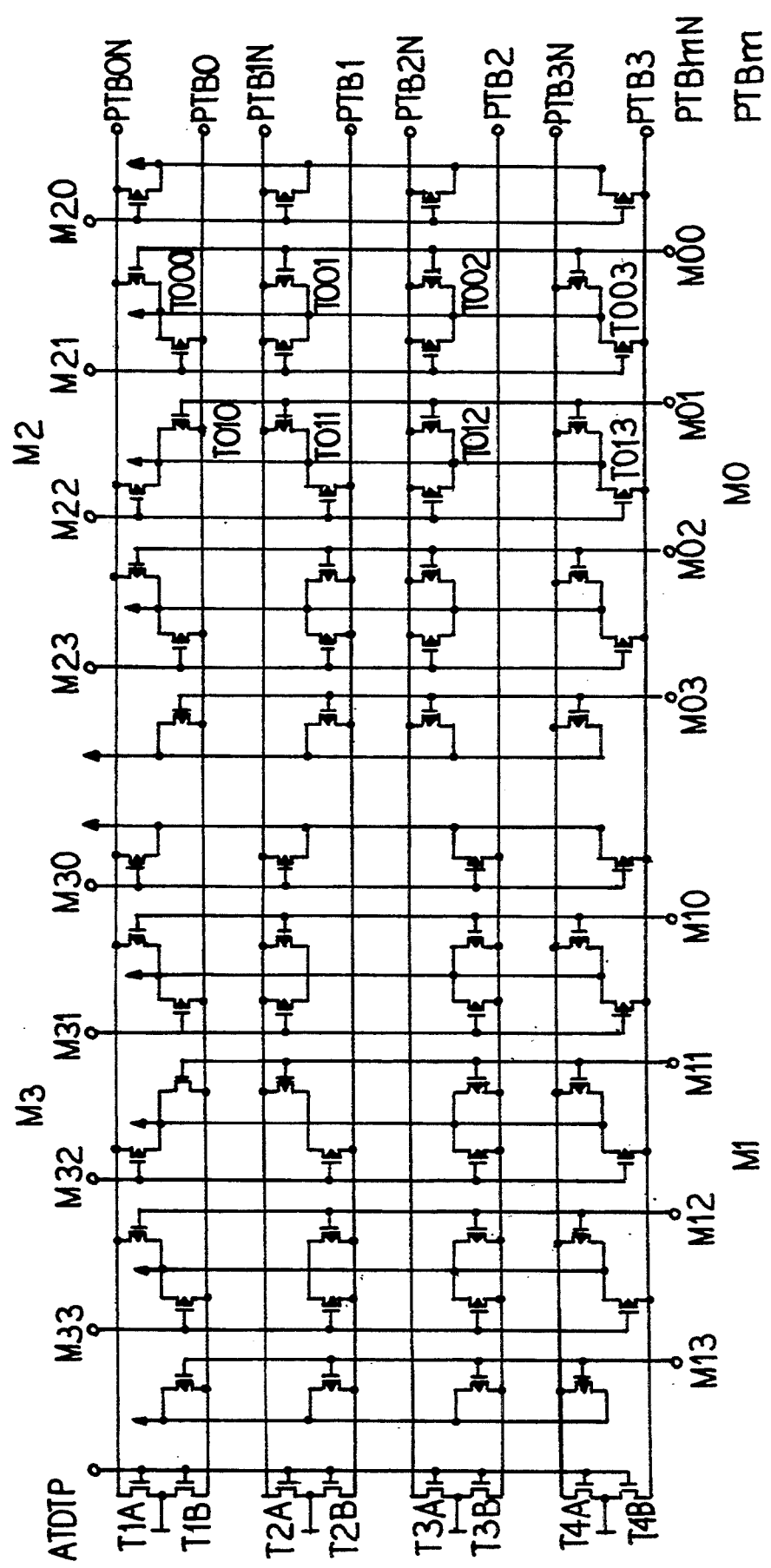
FIG. 6 shows a circuit diagram of a fault address matrix in a circuit arrangement according to the invention, having pairs of wired-OR lines.

In the block diagram of a semiconductor memory shown in FIG. 1, a memory cell array SPZF constructed of individual memory cells SPZ is presented in a simplified form, in which individual memory cells SPZ with a common word line WL are grouped into memory cell n-tuples NSPZ, and, in the event of a fault, can be replaced by redundant memory cell n-tuples RNSPZ from the word line WL. The addressing of the individual memory cells SPZ is carried out by means of the word line WL and by bit lines, such that in each case only one selection of bit lines is available on the higher-level data lines DL of a hierarchical data bus structure. A data flow between the memory cell array SPZF and the higher-level data lines DL is possible by means of the data lines DLi' and a data flow between the higher-level data lines DL and a multiplicity of comparator circuits MC is possible by means of data lines DLi. The multiplicity of comparator circuits are already a component of an on-chip circuit arrangement for testing the semiconductor memory, as is the register REG, preceding them. The register REG takes the place of, if necessary, several n-bit-wide registers and exhibits the register inputs TBP' and the register outputs TBP, such that the register outputs are connected both to the plurality of comparator circuits MC and to the higher-level data lines DL. A plurality of registers may be required, possibly for design reasons, or, however, for testing using different test patterns. An address matrix AM, according to the invention, connected after the multiplicity of comparator circuits MC, combines the comparator outputs Mik in the form of wired-OR lines PTB and a fault type identification circuit FTE, according to the invention, connected after the address matrix AM, supplies address outputs PTF, an individual-fault output PTSF and a multiple-fault output PTMF.

To test a semiconductor memory, a random test pattern is written into the n-bit-wide register REG via the register inputs TBP'. If a particular test pattern is located in the register REG, this test bit pattern is copied from the register outputs TBP over the data lines DL and DLi' into a plurality of memory cell n-tuples having a common word line WL. Once this has occurred, the bit patterns in the multiplicity of memory cell n-tuples, which can differ from the test bit pattern because of memory faults, are fed via the data lines DLi', DL, DLi to the multiplicity of comparator circuits where they are compared with the test bit pattern which is available at the register output TBP. If a bit pattern differs from the test bit pattern, a fault is undoubtedly present. The converse conclusion to this statement is not permissible, since as a result of an unfavorably selected test pattern, faults such as short circuits between adjacent memory cells are not identified. If all the comparator outputs Mik were now combined through one wired-OR line, only relatively coarse fault location would be possible by means of the word line WL. However, if, as shown in FIG. 1, an address matrix AM having several wired-OR lines PTB for combining the comparator output Mik is used, faulty memory cell n-tuples NSPZ or faulty individual memory cells SPZ can be located. By means of logic connections of the fault type identification circuit FTE an individual-fault signal and a multiple-fault signal are formed in each case from the signals from the wired-OR lines PTB, and are fed to the corresponding outputs PTSF and PTMF.

FIG. 2 shows an arrangement of four comparator circuits for testing semiconductor memories, in which data line pairs DLiO,ON . . . DLi3,3N are comparable with register output pairs TPBO,ON . . . TBP3,3N and the comparators have the comparator outputs Mi0 . . . Mi3. In this case, an individual comparator circuit consists essentially of a comparator CMP, which is also used in the circuit arrangement of Arimoto et al., quoted initially. The comparator CMP consists of six n-channel MOS-transistors 14 to 19, in which a series circuit of the transistors 14 and 17 connects a data line DLi3 to the gate of the transistor 19 and a series circuit of the transistors 15 and 16 connects a data line DLi3N, which carries the inverted signal of the data line DLi3, to the gate of the transistor 19. The gate of the transistor 16 is connected to a register output TPB3 and the gate of the transistor 17 is connected to a register output TPB3N, which carries the inverted signal of the register output TPB3. The two gates of the transistors 14 and 15 are activated via a control line COMP and the gate of the transistor 18, which switches the gate of the transistor 19 through to reference potential, is activated via a further control line ATDTP. The transistor 19 is located between reference potential and a comparator output Mi3, which is connected via a p-channel MOS-transistor 20 to a supply voltage V. The gate of the transistor 20 is connected to a control line ATDTPN, which, in turn, is connected via an inverter I to the control line ATDTP.

If, for instance, the data line DLi3 carries high potential and, in consequence, the data line DLi3N carries low potential, when the control line COMP carries high potential, the gate of the transistor 19 can maintain a high potential only when the register output TPB3N carries high potential and, in consequence, the register output TPB3 carries low potential. The corresponding situation applies to the case where the data line DLi3 carries low potential and the register output TPB3 carries high potential. The gate of the transistor 19 thus receives high potential only in the case when a test bit from the register does not correspond to the bit from a memory cell that has been read out. In this case, the transistor 19 becomes conductive and, in the event of a fault, the comparator output Mi3 receives a low potential. A reset of the comparator circuit is effected in the manner that the control line ATDTP receives high potential, so that the transistor 18 becomes conductive, resulting in the gate of the transistor 19 receiving low potential and the transistor 19 thus being cut off. The control line ATDTPN receives low potential through the inverter I, through which the transistor 20 becomes conductive and the comparator output Mi3 receives high potential in a defined manner.

FIG. 3 shows an arrangement of four comparator circuits in a circuit arrangement according to the invention for testing semiconductor memories, in which signals from data line pairs DLi0,0N . . . DLi3,3N are comparable with signals from register output pairs TPB0,0N . . . TPB3,3N and the comparator circuits have comparator outputs Mi0 . . . Mi3. In this case, an individual comparator circuit is formed by a parity inverting circuit PD consisting of four n-channel MOS-transistors 4 to 7 and a differential amplifier 3. In the case of this parity inverting circuit, a data line DLi3 can be connected via the transistor 4 through to the inverting input 1 and via the transistor 5 through to the non-inverting input 2 of the differential amplifier 3. Correspondingly, the data line DLi3N, carrying the inverted signal of the data line DLi3, can also be connected via the transistor 6 through to the inverting input 1 and via the transistor 7 through to the non-inverting input 2 of the differential amplifier 3. For this purpose, the gates of the transistors 5 and 6 are connected to the register output TPB3 and the gates of the transistors 4 and 7 are connected to the register output TPB3N, carrying the inverted signal of the register output TPB3. The differential amplifier 3, whose output is the comparator output Mi3, has a reset input which is connected to a control line ATDTPN.

If the data line DLi3 carries high potential and, hence, the data line DLi3N carries low potential, in the case of a fault, that is to say when the register output TPB3 carries low potential and the register output TPB3N carries high potential, high potential passes via the transistor 4 to the inverting input of the differential amplifier 3, and low potential passes via the transistor 7 to the non-inverting input of the differential amplifier 3. In the event of a fault, the differential amplifier 3 inverts (reverses) the signal on the data line DLi3 and assumes low potential at its output Mi3. If no fault occurs, the transistors 5 and 6 become conductive, the differential amplifier does not invert and the output Mi3 of the differential amplifier 3 assumes high potential.

In FIG. 4, the differential amplifier shown in FIG. 3 is described in more detail. The differential amplifier has an inverting input 1, a non-inverting input 2, a reset input R, an output M and is constructed of three n-channel MOS transistors 8, 9 and 13 and three p-channel MOS transistors 10, 11 and 12, the drain connection of each of the transistors 10, 11 and 12 being connected to a supply voltage v. The transistors 8 to 11 form a bridge circuit, the transistors 10, 11 being the load elements. The source connections of the transistors 8, 9 are connected to the drain connection of the transistor 13 which, for its part is connected via its source connection to the reference potential. The gate of the transistor 8 is connected to the non-inverting input 2 and the gate of the transistor 9 is connected to the inverting input 1. The junction point between the transistor 8 and the transistor 10, the latter being used as the load element, is connected to the gates of the transistors 10 and 11, and the junction point between the transistor 9 and the transistor 11, the latter being used as a load element, is fed out as the amplifier output M. A reset input R is connected to the gate of the transistor 13 and the gate of the transistor 12, transistor 12 being connected in parallel with transistor 11.

If high potential is applied to input 1, and low potential is applied to input 2, transistor 9 becomes conductive and transistor 8 is cut off, resulting in output M being at low potential. If low potential is applied to the inverting input 1, and high potential is applied to the non-inverting input 2, the transistor 9 is cut off and the transistor 8 becomes conductive, resulting in the output M being at high potential. To implement a reset, the reset input R is switched from high potential to low potential, thus cutting off transistor 13 and connecting output M via a low-resistance path to the power supply voltage V so that it is at high potential.

The circuit diagram shown in FIG. 5 consists of a combination of the comparator outputs M00 . . . M33 through the wired-OR lines PTB, four wired-OR lines being provided for better fault locating and, a logic connection not being made simply by connecting lines, as in the case of Arimoto et al., but via p-channel switching transistors T00 . . . T33. By way of example, the comparator outputs M00 . . . M03 form a quadruple M0 and are connected to the gates of transistors T00 . . . T03, which, in turn, are connected in each case via their source connection to the supply voltage V and via the 10 drain connection to a wired-OR line, the wired-OR line being connected to an address output PTF0. The wired-0R line connected to the address output PTF0 is connected in a switchable manner to the reference potential through an n-channel switching transistor T1, whose gate is connected to a control line ATDTP, and the wired-OR line is connected via an inverter I1 to an address output PTF0N. In a corresponding manner, in each case one further quadruple M1 to M3 is connected via precisely one wired-OR line to the address output PTF1 to PTF3, these wired-OR lines being connected in a switchable manner, in each case via transistors T2 to T4, to reference potential and these wired-OR lines being connected via inverters I2 to I4 to the address outputs PTF1 to PTF3. Since 16 comparator outputs are combined into four quadruples, 16/4 = 4 wired-OR lines, 16 p-channel switching transistors, 16/4=4 n-channel switching transistors and 16/4=4 inverters are required. A fault can be located to quadruple level and, since each quadruple is assigned to its own address output, multiple faults can also be unambiguously assigned. However, a critical disadvantage of this circuit arrangement is that, with a relatively large number of comparator outputs, a very large number of wired-OR lines is required. If, for example, 256 comparator outputs are combined into quadruples, even this results in 256/4=64 wired-OR lines being required.

If the control signal line ATDTP is maintained at high potential, the transistors 1 to 4 become conductive and the wired-OR lines can discharge themselves to reference potential (low). If, for example, one or more faults then occur during the test in one quadruple of comparator outputs M00 . . . M03, the quadruple M0 is thus faulty and the wired-OR lines connected to the address output PTF0 are connected through at least one of the transistors T00 . . . T03 to the supply voltage V, through which the output PTF0 receives high potential and thus indicates a faulty quadruple M0.

FIG. 6 shows a fault address matrix of a circuit arrangement according to the invention for testing semiconductor memories, in which the comparator outputs are combined by pairs of wired-OR lines PTBm, PTBmN, such that fault locating to individual memory cell level is possible. Since a diversion from faulty individual memory cells to redundant individual memory cells is highly complex, an address matrix in the form of a fault address matrix is worthwhile, as a rule, only for fault analyses. If, as shown in FIG. 6, for example, 16 comparator outputs M00 . . . M33 are grouped to form four quadruples M0 . . . M3 (test bit pattern with 4-bit word length), but are linked on the individual memory cell level, a minimum of 1d (16)=4 pairs of wired-OR lines PTB0, PTB0N . . . PTB3, PTB3N are required for unambiguous derivation of a fault address. The pairs of wired-OR lines can be connected via n-channel switching transistors T1A, T1B . . . T4A, T4B to the reference potential, the gates of the switching transistors being connected to a control line ATDTP. In each case one line, for example line PTBm, of a pair of wired-OR lines PTBm,PTBmN is a one-line and the other is a zero-line. One comparator output, for example M0, is now linked via 1d (16)=4 p-channel switching transistors, for example T000 . . . T003, according to an unambiguously assigned binary code, for example 0000, only to zero-lines PTBmN, through which logic links are made, such that a comparator output is connected to the gates, a supply voltage V is connected to the source connections and the wired-OR lines are connected to the drain connections of the four p-channel switching transistors. A further comparator output M01 is then assigned, for example, a binary code 0001 and, in contrast to comparator output MOO, the source connection of the p-channel switching transistor T010 is now not connected to the zero-line but to the one-line and only the transistors T011 . . . T013, like the transistors T00 T003, are connected to the zero-lines. In a corresponding manner, all the comparator outputs M00 . . . M33 are linked according to their assigned binary code via transistors to one-lines and/or zero-lines. For a fault address matrix for linking 16 comparator outputs, 1d (16) =4 pairs of wired-OR lines, 2* 1d (16)=8 n-channel switching transistors T1A . . . T4D and 16 * 1d (16)=64 p-channel switching transistors T000 . . . T333 are required.

If high potential is applied to the control line ATDTP, the n-channel switching transistors T1A . . . T4B become conductive and low potential is set both on the one-lines and on the zero-lines, since the wired-OR lines, which may be charged up, can discharge themselves to reference potential. If, for example, the comparator output M01 supplies low potential, the test bit and the read-out bit do not correspond to one another and a fault is present. The low potential at the gates of the p-channel switching transistors T010 . . . T013 results in them becoming conductive, through which the one-line PTB0 and the zero-line PTB1N . . . PTB3N are placed at high potential, corresponding to a fault address 0001. Each fault address not equal to 0000 means that there is at least one faulty individual memory cell. If a fault address is equal to 0000, this can mean that there is no faulty individual memory cell or that the individual memory cell with the fault address 0000 is faulty. Since, with 4 bits, only 16 states can be unambiguously designated and 16 individual memory cells can be faulty, a further bit, for example, must be provided for the fault-free case. If it is confirmed that one individual fault is present (only one individual memory cell of the 16 individual memory cells is faulty), the fault address unambiguously defines the address of the faulty individual memory cell. If a plurality of faulty individual memory cells are present, the fault address results in a bit-by-bit OR-linking of individual fault addresses and, in this case, the fault address is invariably not equal to 0000.

FIG. 7 shows a circuit diagram of a circuit arrangement according to the invention, which contains a fault type identification circuit having individual fault identification with simultaneous inversion of a fault address signal. In this case, inputs are provided, for example, for four pairs of wired-OR lines PTB0, PTB0N . . . PTB3, PTB3N and four pairs of fault address outputs PTF0, PTF0n . . . PTF3, PTF3N, in each case one line, for example PTBm, of a pair PTBm, PTBmN of wired-OR lines being connected directly to one output of a pair of fault address outputs PTFm, PTFmN and the other output of the pair of fault address outputs being connected in each case via an inverter, for example IA, to the line, for example PTBm, of the pair of wired-OR lines. The pair of wired-OR lines PTB3, PTB3N is linked, for example, by a circuit EXIN, is connected on the output side to the pair of fault address outputs PTF3, PTF3N and supplies an input signal EX3 for a NAND-circuit NAND. The pairs of wired-OR lines PTB0, PTB0N . . . PTB2, PTB2N are linked in the same manner and supply further input signals EX0 . . . EX2 for the NAND-circuit NAND. The output of the NAND-circuit NAND is connected via an inverter to the individual-fault output PTSF and is connected directly to an output PTSFN, which carries the inverted signal of the individual-fault output. The circuit EXIN represents an EXOR circuit, which is constructed of two inverters IA, IB and three double NAND-elements N1 . . . N3. For this purpose, the signal on the line PTB3N is linked, by the NAND-element N1, to the signal on the line PTB3, inverted by the inverter IA, the signal on the line PTB3 is linked, by the NAND-element N2, to the signal on the line PTB3N, inverted by the inverter IB, and the outputs of the two NAND-elements N1 and N2 form the inputs of a further NAND-element N3, which supplies an EXOR-linking of the signals on the lines PTB3, PTB3N at the output EX3. One advantage of the EXIN circuit is that the inverter IA can be used for forming an inverted fault output signal.

Since, for forming an address, pairs of wired-OR lines (zero- and one-lines) are used rather than individual wired-OR lines, additional items of information such as, for example, freedom from faults, individual faults and multiple faults, can be formed by logic links of the zero- and one-lines. If an individual fault occurs, pairs of wired-OR lines PTBm, PTBmN, discharged to low potential, are partially linked to high potential, according to the fault address. In an address matrix connected preceding the fault type identification circuit, an identical output is linked via p-channel switching transistors either to a zero-line or to a oneline, according to the individual fault address. From this it follows that in the case of an individual fault the signals on all the zero-lines PTBmNmust differ from the signals on the relevant associated one-lines PTBm. To detect an individual fault, one zero-line is therefore EXOR-linked in each case with the associated one-line and the EXOR-link outputs (EX0 . . . EX3) are combined by an AND-circuit since this condition must be met simultaneously by all the pairs of wired-OR lines.

Figure 8:
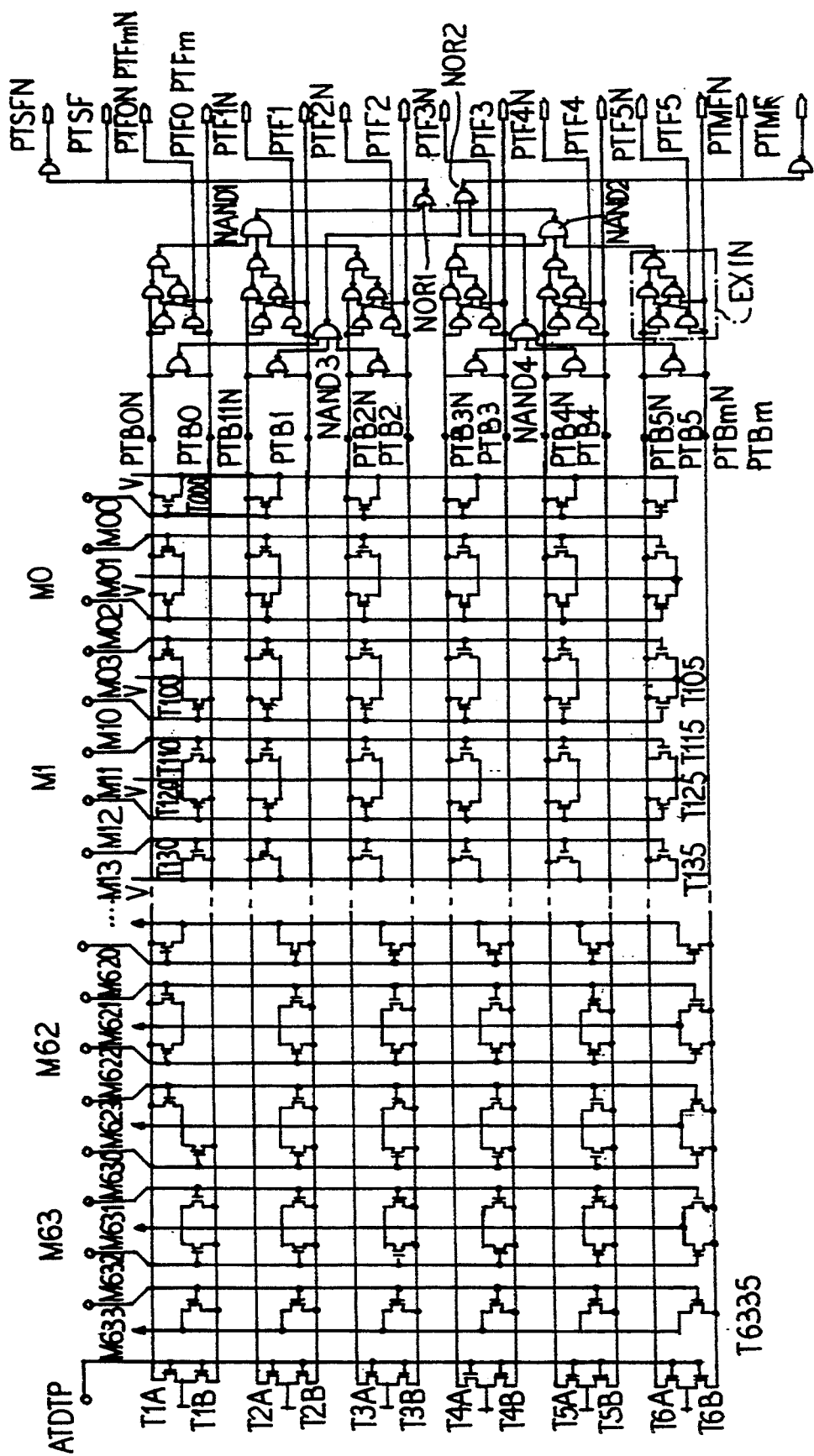
FIG. 8 shows a circuit diagram of a circuit arrangement according to the invention, which contains a redundant address matrix having pairs of wired-OR lines followed by a fault type identification circuit having individual and multiple fault identifications together with simultaneous inversion of a fault address signal.

FIG. 8 shows a circuit diagram of a circuit arrangement according to the invention, which contains a redundant matrix having pairs of wired-OR lines PTPm, PBTmN and is followed by a fault type identification circuit having individual- and multiple-fault identification with simultaneous inversion of a fault address signal. The redundant address matrix differs from a fault address matrix in that the fault locating is not carried out on the individual memory cell level, but only faulty memory cell n-tuples can be detected and can then be redirected to redundant and fault-free memory cell n-tuples. If, for example, as shown in FIG. 8, 256 comparator outputs M00 . . . M633 are grouped to form 64 quadruples M0 . . . M63 (test pattern with 4-bit word length) and are linked in quadruple groups, a minimum of 1d (256/4)=6 pairs of wired-OR lines PTB0, PTB0N . . . PTB5, PTB5N are required to determine a fault address. The pairs of wired-OR lines can be connected to the reference potential via n-channel switching transistors T1A, T1B . . . T6A, T6B, the gates of these switching transistors being connected to a control line ATDTP. In each case, one line, for example a line PTBm, of a pair of wired-OR lines PTBm, PTBmN is a one-line and the other line is a zero-line. A quadruple of four comparator outputs, for example M1, is now linked via 4 * 1d (256/4) =24 p-channel switching transistors T100 . . . T105, T110 T115, T120 . . . T125 and T130 . . . T135 according to an unambiguously assigned binary code, for example 000 001, to one individual line PTB0 and 5 zero-lines PTB1N . . . PTB5N, these links being carried out in such a way that in each case one comparator output is connected to the gates, a supply voltage V is connected to the drain connections and the wired-OR lines are connected to the source connections of in each case 1d (256/4)=6 p-channel switching transistors. The four comparator outputs of a quadruple of comparator outputs are linked in the same manner according to their common quadruple address to zero- and one-lines. In a corresponding manner, all the comparator outputs M00 to M633 are linked via transistors to one-lines and/or zero-lines, according to an unambiguously assigned binary code. For a redundant address matrix for linking 64 quadruples of comparator outputs, 1d (256/4)=6 pairs of wired-OR lines, 2 * 1d (256/4)=12 n-channel switching channel transistors T1A T6B and 256 * 1d (256/4)=1536 p-channel switching transistors T000 . . . T6335 are required.

The input side of the fault type identification circuit connected after the redundant address matrix is connected to the six pairs of wired-OR lines and, on the output side, six pairs of redundant address outputs PTF0, PTF0N . . . PTF5, PTF5N are provided, one line in each case, for example PTBm, of a pair of redundant address outputs PTFm, PTFmN being connected, and the other output of the pair of redundant address outputs in each case being connected via an inverter to the other line, for example PTBm, of the pair of wired-OR lines. As has already been explained in the description of FIG. 7, for the formation of an individual-fault signal in each case both lines of a pair of wired-OR lines are EXOR-linked and the outputs of the EXOR-links are connected by an AND-link, which on the output side is connected to an individual-fault output PTSF. As in FIG. 7, an EXOR-inverter circuit of an EXIN, consisting of two inverters and three NAND-elements, provides both an inverter function for inverting an address output and also an EXOR-linkage of a pair of wired-OR lines. The six pairs of wired-OR lines are EXOR-linked by EXOR-inverter circuits EXIN. An AND-link of the EXOR-link outputs is carried out by two triple NAND-elements NAND1 and NAND2, whose outputs are linked by a double NOR-element NOR1, the output side of the NOR-element being directly connected to an individual-fault output PTSF and via an inverter to an inverted individual-fault output PTSFN. Since only one additional output, such as for example the individual-fault output, allows the decision to be made on whether a fault address 000 000 or freedom from a fault is present, a minimum of 1d (256/4)+1=7 outputs are required for an unambiguous statement.

In addition to a required individual-fault identification circuit, the fault type identification circuit shown in FIG. 8 has a multiple-fault output PTMF, which can also be used, if required, to reduce the loading on an automatic test set. If in each case both lines of a pair of wired-OR lines carry low signals, then no faults are present, if in each case both lines of all pairs of wired-OR lines carry signals differing from one another an individual fault is present and if both lines of at least one pair of wired-OR lines carry high signals then at least two faults are present, that is to say a multiple fault. From this it follows that both lines of a pair of wired-OR lines are in each case to be linked by an AND-element and that the outputs of the AND-element are to be combined by an OR-element into a multiple-fault output. This is achieved in the circuit arrangement represented in FIG. 8 in that in each case both lines of a pair of wired-OR lines are linked by double NAND-elements, the outputs of the double NAND-elements are linked by two triple NAND-elements NAND3 and NAND4 and the outputs of the triple NAND-elements are linked through a double NOR-element NOR2, the output of the double NOR-element being connected via an inverter to the multiple-fault output PTM3 and being connected directly to an inverted multiple-fault outlet PTMFN.

If high potential (reset) is applied to the control line ATDTP, the n-channel switching transistors T1A . . . T6B become conductive and the pairs of wired-OR lines receive low potential, since they are connected to reference potential. Once a reset has been carried out, the control line ATDTP receives low potential and valid comparator results are available at the comparator outputs M00 . . . M633. If a fault occurs in a quadruple memory cell, which is assigned to a quadruple of comparator outputs M1, either six, twelve, eighteen or twenty-four transistors, for example the twenty-four transistors T100 . . . T135, become conductive and connect the zero- and one-lines of the pairs of wired-OR lines to the supply voltage V (high potential), according to the relevant binary code, which is assigned to the memory cell quadruples. For example, if the comparator outputs M10 and M11 supply low potential (fault), in both cases, according to the common quadruple address M1, the same zero- and one-lines are set to high potential and the fault type identification circuit identifies this as an individual fault, since only one individual memory cell quadruple is faulty. However, if for example the comparator outputs M00 and M10, which belong to different quadruples M0 and M1, supply a low signal, the transistors T000 and T100, for example, become conductive, and both the zero-line PTB0N and also the one-line PTB0 receive high potential. The NAND-link of the lines PTB0 and PTB0N supplies low potential, the triple NAND-element NAND3 supplies high potential at the output, since at least one input is at low potential, and the NOR-element NOR1 supplies low potential, which becomes high potential by means of an inverter at the multiple-fault output PTMF. Since the signals on the lines PTB0 and PTB0N no longer differ, the EXOR linkage of the individual fault identification supplies low potential, the output of NAND1 receives high potential and the output of NOR1, and hence also PTSF, receive low potential (no individual fault).

The statements made also apply to a circuit arrangement which has p-channel switching transistors in place of n-channel switching transistors and n-channel switching transistors in place of p-channel switching transistors and whose supply voltage polarity is adapted in the corresponding manner.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A circuit arrangement for testing a semiconductor memory by means of parallel tests using various test bit patterns, comprising: at least one n-bit long register operatively connected to the memory and to a multiplicity of comparator circuits that is also operatively connected to the memory, the multiplicity of comparator circuits having comparator outputs, in which any n-tuples of test bits are written into the at least one n-bit long register, in which, each n-tuple of test bits located in the register is written via data lines of the semiconductor memory into a multiplicity of memory cell n-tuples having a common word line, in which each n-tuple of test bits located in the register is supplied to the multiplicity of comparator circuits, in which bit patterns of the memory cell n-tuples having a common word line are read out via data lines of the semiconductor memory and with which the n-tuples of test bits are compared in the multiplicity of comparator circuits, and in which the comparator outputs of the multiplicity of comparator circuits are combined by wired-OR lines; the comparator outputs of the multiplicity of comparator circuits being combined by pairs of wired-OR lines to form an address matrix and each pair of wired-OR lines corresponding to a respective address bit; each pair of wired-OR lines having a zero-line for a state where the address bit is 0, and a one-line for a state where the address bit is 1; switching transistors of a first conductivity type for switching through all the wired-OR lines to a line which is at reference potential in order to discharge the wired-OR lines before a respective test; switching transistors of a second conductance for switching through one of the zero-line and the one-line of each pair of wired-OR lines by means of each comparator output to a supply voltage; the combination of the switched-through one-lines and zero-lines differing either for all the comparator outputs or for all the n-tuples of comparator outputs; and in each case one line of the pairs of wired-OR lines connected to an address output; said data lines being composed of data line pairs and said register having outputs that are arranged in register output pairs, wherein at least one comparator circuit of the multiplicity of comparator circuits is constructed as a parity inverting circuit having first, second, third and fourth switching transistors and a differential amplifier, wherein a gate of the first switching transistor is connected to a first output of a register output pair and a first line of a data line pair is switched through to an inverting input of the differential amplifier by means of the first switching transistor, wherein a gate of the second switching transistor is connected to a second output of a register output pair and the first line of the data line pair is switched through to a non-inverting input of the differential amplifier, wherein a gate of the third transistor is connected to a second output of the register output pair and a second line of the data line pair is switched through to the inverting input of the differential amplifier by means of the third switching transistor, wherein a gate of the fourth switching transistor is connected to the first output of the register output pair and the second line of the data line pair is switched through to the non-inverting input of the differential amplifier by means of the fourth switching transistor, wherein for the register output pairs, the second output of each of the register output pairs carries an inverted signal of a respective first output and for the data line pairs, the second line of each of the data line pairs carries an inverted signal of the first line, wherein during testing of a memory cell, the first line of the data line pair carries the same logic signal as the second output of the register output pair, if a test bit written into the memory cell corresponds to a bit read out of the memory cell, and wherein one comparator output is connected to the output of the differential amplifier.

2. The circuit arrangement as claimed in claim 1, wherein the address matrix is constructed as a fault address matrix, in order to locate faulty individual memory cells of the semiconductor memory, wherein for this purpose a binary code is assigned unambiguously to each comparator output, and wherein the supply voltage is switched through to the combination of one-lines and zero-lines corresponding to the binary code, via respective switching transistors of the second conductance type.

3. The circuit arrangement as claimed in claim 1, wherein the address matrix is constructed as a redundant address matrix, to locate faulty memory cell n-tuples, wherein for this purpose a binary code is assigned unambiguously to each n-tuple of comparator outputs, and wherein the supply voltage is switched through to the combination of one-lines and zero-lines corresponding to the binary code, via respective switching transistors of the second conductance type.

4. The circuit arrangement as claimed in claim 1, further comprising a fault type identification circuit having inputs and outputs, wherein the pairs of wired-OR lines are connected to the inputs of the fault type identification circuit.

5. The circuit arrangement as claimed in claim 4, wherein the fault type identification circuit contains a circuit element for identifying individual faults, wherein said circuit element feeds the pairs of wired-OR lines in each case to an EXOR-link, and wherein outputs of the EXOR-link are combined by an AND-link, an output of which is connected to an individual-fault output of the outputs of the fault type identification circuit.

6. The circuit arrangement as claimed in claim 5, wherein the EXOR-links in the fault type identification circuit are implemented by means of a circuit having three double NAND-gates and two inverters.

7. The circuit arrangement as claimed in claim 4, wherein the fault type identification circuit contains a circuit element for identifying multiple faults, wherein said circuit element feeds the pairs of wired-OR lines in each case to an AND-link, and wherein outputs of the AND-links are combined by an OR-link, whose output is connected to a multiple-fault output of the outputs of the fault type identification circuit.

8. A circuit arrangement for testing a semiconductor memory by means of parallel tests using various test bit patterns, comprising: at least one n-bit long register operatively connected to the memory and to a multiplicity of comparator circuits that is also operatively connected to the memory, the multiplicity of comparator circuits having comparator outputs, in which any n-tuples of test bits are written into the at least one n-bit long register, in which, each n-tuple of test bits located in the register is written via data lines of the semiconductor memory into a multiplicity of memory cell n-tuples having a common word line, in which each n-tuple of test bits located in the register is supplied to the multiplicity of comparator circuits, in which bit patterns of the memory cell n-tuples having a common word line are read out via data lines of the semiconductor memory and with which the n-tuples of test bits are compared in the multiplicity of comparator circuits, and in which the comparator outputs of the multiplicity of comparator circuits are combined by wired-OR lines; the comparator outputs of the multiplicity of comparator circuits being combined by pairs of wired-OR lines to form an address matrix and each pair of wired-OR lines corresponding to a respective address bit; each pair of wired-OR lines having a zero-line for a state where the address bit is 0, and a one-line for a state where the address bit is 1, switching transistors of a first conductivity type for switching through all the wired-OR lines to a line which is at reference potential in order to discharge the wired-OR lines before a respective test; switching transistors of a second conductance type for switching through one of the zero-line and the one-line of each pair of wired-OR lines by means of each comparator output to a supply voltage; the combination of the switched-through one-lines and zero-lines differing either for all the comparator outputs or for all the n-tuples of comparator outputs; and in each case one line of the pairs of wired-OR lines connected to an address output; said data lines being composed of data line pairs and said register having outputs that are arranged in register output pairs, wherein at least one comparator circuit of the multiplicity of comparator circuits is constructed as a parity inverting circuit having first, second, third and fourth switching means and a differential amplifier, wherein the first switching means is connected to a first output of a register output pair and a first line of a data line pair is switched through to an inverting input of the differential amplifier by means of the first switching means, wherein the second switching means is connected to a second output of a register output pair and the first line of the data line pair is switched through to a non-inverting input of the differential amplifier, wherein the third switching means is connected to a second output of the register output pair and a second line of the data line pair is switched through to the inverting input of the differential amplifier by means of the third switching means, wherein the fourth switching means is connected to the first output of the register output pair and the second line of the data line pair is switched through to the non-inverting input of the differential amplifier by means of the fourth switching means, wherein for the register output pairs, the second output of each of the register output pairs carries an inverted signal of a respective first output and for the data line pairs, the second line of each of the data line pairs carries an inverted signal of the first line, wherein during testing of a memory cell, the first line of the data line pair carries the same logic signal as the second output of the register output pair, if a test bit written into the memory cell corresponds to a bit read out of the memory cell, and wherein one comparator output is connected to the output of the differential amplifier.

* * * * *